United States Patent
Lee

(10) Patent No.: US 6,377,487 B1
(45) Date of Patent: Apr. 23, 2002

(54) FLASH MEMORY DEVICE

(75) Inventor: Jong Sang Lee, Ichon (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/722,489

(22) Filed: Nov. 28, 2000

(30) Foreign Application Priority Data

Dec. 28, 1999 (KR) .............................. 99-63978

(51) Int. Cl.[7] .............................................. G11C 11/34
(52) U.S. Cl. .............................. 365/185.11; 365/185.33
(58) Field of Search ........................ 365/185.11, 185.33

(56) References Cited

U.S. PATENT DOCUMENTS 5,561,627 A * 10/1996 Matsubara et al. .... 365/185.04

* cited by examiner

Primary Examiner—Trong Phan
Assistant Examiner—M. Tran
(74) Attorney, Agent, or Firm—Pennie & Edmonds LLP

(57) ABSTRACT

A flash memory device comprises a bank register for selecting the program/erase state of each of the banks, a mode controller for outputting the mode signal of the bank selected by the bank register, an address controller for independently separating an external address into an internal address depending on the output from the bank register, and a plurality of banks for simultaneously performing the program/erase operation and the read-out operation, depending on the mode signal and the internal address.

10 Claims, 1 Drawing Sheet

FLASH MEMORY DEVICE

FIELD OF THE INVENTION

The invention relates generally to a flash memory device. More particularly, it relates to a flash memory device capable of reading out other sectors during the program/erase operation.

BACKGROUND OF THE INVENTION

Generally, during the program operation, if a voltage of about 5 volt is applied to the drain and a voltage of about 9 volt is applied to the control gate, electrons moving from the source to the drain are generating hot electrons in the drain at the boundary of the P-well. Then, the hot electrons are attracted to the floating gate by the bias of the control gate to thus increase the threshold voltage of the transistor that is formed by the floating gate, thus causing the cell to be a program state. In the program operation of the stack gate flash EEPROM, the efficiency in which the hot electrons are generated is an important factor.

Upon erase operation, if a voltage of about 5 volt is applied to the source and a voltage of about −10 volt is applied to the control gate (the drain is at a floating state), a so called F-N tunneling effect is generated through the tunnel oxide film due to the voltage potential between the floating gate and the source, so that the electrons exit toward the source. Thus, the threshold voltage of the transistor, formed by the floating gate, is reduced, thus causing the cell to be an erase state. Also, another erase method is to float the source and the drain, to apply a voltage of about −8 volt to the control gate and to apply a voltage of about 8 volt to the P-well so that electrons in the floating gate can exit toward the P-well. In the erase operation of the stack gate flash EEPROM, the voltage potential between the floating gate and the source or the P-well becomes an important factor. Thus, the erase characteristic (rate) is determined by the ratio of the capacitance of the insulating film surrounding the floating gate to the capacitance of the dielectric film between the control gate and the floating gate. Therefore, the erase rate of the cell could not be made uniform unless the value of the capacitance is constant regardless of the number of the cells.

In the read-out operation, it recognizes data by applying a voltage of about 5 volt to the control gate and a voltage of about 1 volt to the drain and sensing the current flowing through the cell so that the on/off of the cell can be read.

During the operation, the conventional flash memory could read out the data on other flash memory cell after the program/erase operation is completed or suspended. However, as the program/erase operation of the flash memory takes a very long time compared to the read-out operation, the read-out operation, after the program/erase operation is finished, will hamper the entire operation of the system.

SUMMARY OF THE INVENTION

It is therefore an object of the present invention to provide a flash memory device capable of reading out other sectors during the program/erase operation.

In order to accomplish the above object, the flash memory device according to the present invention is characterized in that it comprises a bank register for selecting the program/erase state of each of the banks, a mode controller for outputting the mode signal of the bank selected by the bank register, an address controller for independently separating an external address into an internal address depending on the output from the bank register, and a plurality of banks for simultaneously performing the program/erase operation and the read-out operation, depending on the mode signal and the internal address.

BRIEF DESCRIPTION OF THE DRAWINGS

The aforementioned aspects and other features of the present invention will be explained in the following description, taken in conjunction with the accompanying drawing, wherein.

DETAILED DESCRIPTION OF PREFERRED EMBODIMENTS

Figure 1:
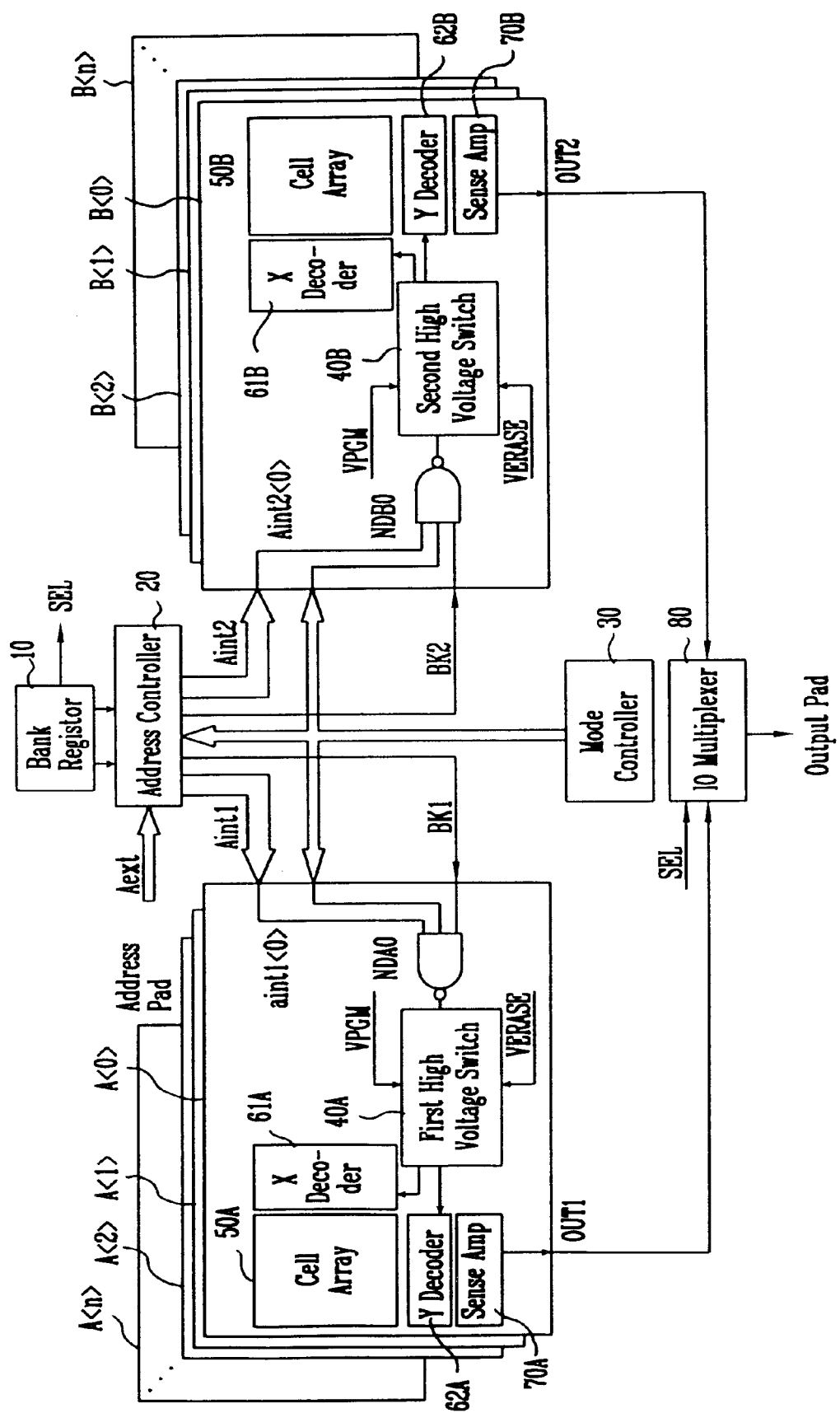
FIG. 1 is a block diagram for explaining a flash memory device according to the present invention.

The present invention will be described in detail by way of a preferred embodiment with reference to the accompanying drawing.

Referring now to FIG. 1, there is shown a block diagram for explaining a flash memory device according to the present invention.

The flash memory device according to the present invention includes an address controller 20 for separating independently the external addresses Aext inputted through the address pad into the addresses of each of the banks. A first internal address Aint1 independently separated from the address controller 20 is inputted to the bank A and a second internal address Aint2 is inputted to the bank B. The bank register 10 stores their corresponding banks upon the input of the program/erase command and the output signals BK1 and BK2 are inputted to the address controller 20, the bank A and the bank B.

Also, the output of the mode controller 30 that outputs the program/erase mode signal of the bank A and the bank B is inputted to the bank A, the bank B and the address controller 20 at the same time. The output multiplexer 80 for multiplexing the output OUT1 of the bank B the output OUT2 of the bank A depending on the output select signal SEL of the bank register 10 is connected to the output pad. The address controller 20 outputs the internal address to the bank to be programmed or erased depending on the select signals BK1 and BK2 outputted from the bank register 10 while it outputs the external address Aext as the internal address to the bank that will not be programmed/erased.

On the other hand, the bank A comprises the banks A<0> to A<n>. However, as they have the same structure, only the bank A<0> will be explained as an example.

The bank A<0> includes a NAND gate NDA0 for combining a first internal address Aint1<0>, a select signal BK1 and the output of the mode controller 30. The output of the NAND gate NDA0 is connected to the first high voltage switch 40A. At this time, the first high voltage switch 40A supplies the program voltage VPGM or the erase voltage VERASE to the X decoder 61A and the Y decoder 62A depending on the output signal of the NAND gate NDA0. The sense amplifier 70A senses the data of the cell array 50A to output OUT1 to the output multiplexer 80.

The bank B comprises banks B<0> through B<n>. However, as they have the same structure, only the bank B<0> will be explained as an example.

The bank B<0> includes a NAND gate NDB0 for combining a first internal address Bint1<0>, a select signal BK2 and the output of the mode controller 30. The output of the NAND gate NDB0 is connected to the second high voltage switch 40B. At this time, the first high voltage switch 40B supplies the program voltage VPGM or the erase voltage VERASE to the X decoder 61B and the Y decoder 62B depending on the output signal of the NAND gate NDB0. The sense amplifier 70B senses the data of the cell array 50B to output OUT2 to the output multiplexer 80.

The operation of the flash memory device according to the above-mentioned construction will be explained below.

The address controller 20 independently separates the external address Aext inputted through the address pad to output the first internal address Aint1 and the second internal address Aint2 to respective banks. The signal outputted from the mode controller 30 is inputted to each of the banks. If the internal address is inputted to each of the banks, a bias such as the program voltage VPGM or the erase voltage VERASE is applied to the cell array of the corresponding internal address.

At this time, as one of the first and second internal addresses is the corresponding address by the mode controller 30 and the other internal address is the internal address for read-out, the program voltage VPGM or the erase voltage VERASE is biased to the cell array in the one bank and the read-out is applied to the cell array in the remaining bank.

On the other hand, the bank register 10 stores information on the bank corresponding to the address when the program or erase command is inputted and then outputs the signals BK1 and BK2 therefore. That is, if the bank A is the program or the erase, the select signal BK1 is enabled. At this time, the address controller 20 outputs the first internal address Aint1 from which the external address Aext is independently separated, for the program/erase operation, to the bank A, and also outputs the external address Aext as the second address to the bank B for the read-out operation. The mode controller 30 outputs the program/erase mode signal to the banks A and B. However, as the signal BK1 outputted from the bank register 10 is enabled, the first high voltage switch 40A of the bank A is operated to bias the program/erase voltage to the cell array 50A specified by the first internal address Aint1.

At this time, as the select signal BK2 outputted from the bank register 10 is not enabled, the bank B is not affected by the mode signal outputted from the mode controller 30. The bank B becomes a read-out state and the sense amplifier 70B thus senses the cell corresponding to the second internal address from the cell array 50B to output the sensed cell. The output multiplexer 80 outputs the output OUT2 of the bank B to the output pad by means of the signal SEL outputted from the bank register 10.

According to the flash memory device of the present invention, it can improve the operation of the system since the other bank can perform a read-out operation while one bank performs the program/erase operation even without additional operations such as suspend operation, etc.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A flash memory device comprising:
    a bank register for storing information on the bank when program/erase commands are inputted;
    a mode controller for outputting program/erase mode signals;
    an address controller for separating an external address into a first internal address for performing a program/erase operation and a second internal address for performing a read-out operation, depending on an output from said bank register; and
    a plurality of banks for performing the program/erase operation and the read-out operation depending on an output signal of said bank register, said mode signal and said first and second internal addresses;
    wherein said address controller outputs the first internal address to a first bank for performing the program/erase operation and outputs the second internal address to a second bank for performing the read-out operation.

2. The flash memory device according to claim 1, wherein said second internal address comprises said external address.

3. A flash memory device comprising:
    a bank register for storing information on the bank when program/erase commands are inputted;
    a mode controller for outputting program/erase mode signals;
    an address controller for separating an external address into a first internal address for performing a program/erase operation and a second internal address for performing a read-out operation, depending on an output from said bank register; and
    a plurality of banks for performing the program/erase operation and the read-out operation depending on an output signal of said bank register, said mode signal and said first and second internal addresses;
    wherein said first bank comprises a high voltage switch for selectively supplying a program voltage or an erase voltage to a cell array.

4. A flash memory device configured to simultaneously program or erase at least a first cell within a first cell array, and read-out at least a second cell within a second cell array, the flash memory device comprising:
    a first bank which includes said first cell and a second bank which includes said second cell;
    an address controller having an external address input thereto, the address controller configured to output a first address for performing a program/erase operation and a second address for performing a read-out operation;
    a mode controller configured to output a mode signal to said first and second banks and also to said address controller; and
    a bank register configured to selectively output either a first enable signal to said first bank or a second enable signal to said second bank, said first and second enable signals also being provided to said address controller, wherein
    one of first and second banks performs a program/erase operation and the other of said first and second banks performs a read operation, depending on said mode signal, said first address, and which of said first and second enable signals is enabled.

5. The flash memory device according to claim 4, wherein said address controller outputs the first address to a first bank for performing the program/erase operation and outputs the second address to a second bank for performing the read-out operation.

6. The flash memory device according to claim 5, wherein said second internal address comprises said external address.

7. The flash memory device according to claim 5, wherein said first bank comprises a high voltage switch for selectively supplying a program voltage or an erase voltage to a cell array.

8. A flash memory device having at least first and second banks comprising:
- a bank register for storing information in the first and second banks when program/erase commands are inputted;
- a mode controller for outputting program/erase mode signals;
- an address controller for outputting first and second internal addresses to said first and second banks, respectively, in response to an external address, an output from said bank register and an output from said mode controller so that one of said first and second banks performs a program/erase operation while the other of said first and second banks performs a read-out operation, in which said first internal address is used to perform the program/erase operation and said second internal address is used to perform the read-out operation; and
- an output multiplexer for multiplexing outputs of said first and second banks.

9. The flash memory device according to claim 8, wherein said second internal address comprises said external address.

10. The flash memory device according to claim 8, wherein said first bank comprises a high voltage switch for selectively supplying a program voltage or an erase voltage to a cell array.

* * * * *